United States Patent
Tsai et al.

(10) Patent No.: US 9,627,256 B2
(45) Date of Patent: Apr. 18, 2017

(54) INTEGRATED CIRCUIT INTERCONNECTS AND METHODS OF MAKING SAME

(71) Applicant: Taiwan Semiconductor Manufacturing Company, Ltd., Hsin-Chu (TW)

(72) Inventors: Cheng-Hsiung Tsai, Miaoli County (TW); Chung-Ju Lee, Hsin-Chu (TW); Bo-Jiun Lin, Jhubei (TW); Hsien-Chang Wu, Taichung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 121 days.

(21) Appl. No.: 13/779,373

(22) Filed: Feb. 27, 2013

(65) Prior Publication Data

US 2014/0239501 A1 Aug. 28, 2014

(51) Int. Cl.
*H01L 21/00* (2006.01)
*H01L 27/00* (2006.01)
(Continued)

(52) U.S. Cl.
CPC .. *H01L 21/76877* (2013.01); *H01L 21/32136* (2013.01); *H01L 21/76831* (2013.01); *H01L 21/76883* (2013.01); *H01L 21/76885* (2013.01); *H01L 23/5226* (2013.01); *H01L 23/53233* (2013.01); *H01L 23/53238* (2013.01); *H01L 23/53295* (2013.01); *H01L 21/31144* (2013.01);
(Continued)

(58) Field of Classification Search
CPC ............. H01L 21/768; H01L 23/53238; H01L 2924/01029; H01L 21/30625; H01L 21/76898; H01L 21/76841; H01L 21/76846; H01L 23/481; H01L 21/76816; H01L 21/76834; H01L 21/76867; H01L 21/76873; H01L 21/76; H01L 21/76849; H01L 21/7685; H01L 21/76877; H01L 23/5226; H01L 23/53295; H01L 23/53233
USPC ....... 438/692, 637, 618, 653, 627, 643, 687, 438/622, 623, 625, 628, 648, 650, 652, 438/654, 656; 257/750, 751, 752, 758
See application file for complete search history.

(56) References Cited

U.S. PATENT DOCUMENTS 4,795,722 A * 1/1989 Welch ............... H01L 21/32053
148/DIG. 11
5,252,517 A * 10/1993 Blalock et al. ............... 438/396
(Continued)

*Primary Examiner* — Dale E Page
*Assistant Examiner* — Quovaunda V Jefferson
(74) *Attorney, Agent, or Firm* — Slater Matsil, LLP

(57) ABSTRACT

A dielectric layer is formed on a substrate and patterned to form an opening. The opening is filled and the dielectric layer is covered with a metal layer. The metal layer is thereafter planarized so that the metal layer is co-planar with the top of the dielectric layer. The metal layer is etched back a predetermined thickness from the top of the dielectric layer to expose the inside sidewalls thereof. A sidewall barrier layer is formed on the sidewalls of the dielectric layer. A copper-containing layer is formed over the metal layer, the dielectric layer, and the sidewall barrier layers. The copper-containing layer is etched to form interconnect features, wherein the etching stops at the sidewall barrier layers at approximately the juncture of the sidewall of the dielectric layer and the copper-containing layer and does not etch into the underlying metal layer.

20 Claims, 6 Drawing Sheets

(51) Int. Cl.
*H01L 21/768* (2006.01)
*H01L 23/522* (2006.01)
*H01L 23/532* (2006.01)
*H01L 21/3213* (2006.01)
*H01L 21/311* (2006.01)

(52) U.S. Cl.
CPC ..... *H01L 21/32139* (2013.01); *H01L 2924/0002* (2013.01)

(56) References Cited

U.S. PATENT DOCUMENTS

| | | | | |
|---|---|---|---|---|
| 5,670,406 | A * | 9/1997 | Tseng | 438/396 |
| 6,063,506 | A * | 5/2000 | Andricacos et al. | 428/546 |
| 6,251,790 | B1 * | 6/2001 | Jeong | 438/697 |
| 6,423,384 | B1 * | 7/2002 | Khazeni et al. | 427/577 |
| 6,509,257 | B1 * | 1/2003 | Chen | 438/622 |
| 6,656,842 | B2 * | 12/2003 | Li et al. | 438/691 |
| 6,730,594 | B2 * | 5/2004 | Noguchi et al. | 438/653 |
| 7,115,467 | B2 * | 10/2006 | Ajmera | H01L 28/75 257/E21.021 |
| 7,166,532 | B2 * | 1/2007 | Chun | H01L 21/76807 257/E21.585 |
| 7,432,528 | B2 * | 10/2008 | Chou | G02F 1/1365 257/59 |
| 7,606,021 | B2 * | 10/2009 | Shih | H01L 28/40 257/532 |
| 8,174,124 | B2 * | 5/2012 | Chiu et al. | 257/773 |
| 9,449,921 | B1 * | 9/2016 | Basker | H01L 23/485 |
| 2001/0023167 | A1 * | 9/2001 | Kimura | B24B 37/013 451/288 |
| 2002/0096778 | A1 * | 7/2002 | Cox | 257/774 |
| 2002/0098675 | A1 * | 7/2002 | Lin | 438/618 |
| 2002/0140103 | A1 * | 10/2002 | Kloster et al. | 257/767 |
| 2005/0287803 | A1 * | 12/2005 | Lee | H01L 21/76802 438/672 |
| 2008/0075836 | A1 * | 3/2008 | Chen et al. | 427/58 |
| 2009/0294925 | A1 * | 12/2009 | Lin et al. | 257/635 |
| 2010/0187670 | A1 * | 7/2010 | Lin et al. | 257/686 |
| 2012/0003832 | A1 * | 1/2012 | Bartsch et al. | 438/666 |
| 2012/0104622 | A1 * | 5/2012 | Kim et al. | 257/774 |
| 2012/0326313 | A1 * | 12/2012 | Uzoh et al. | 257/751 |
| 2013/0071955 | A1 * | 3/2013 | Kintaka et al. | 438/9 |
| 2014/0252622 | A1 * | 9/2014 | Peng | H01L 23/53238 257/751 |

\* cited by examiner

INTEGRATED CIRCUIT INTERCONNECTS AND METHODS OF MAKING SAME

BACKGROUND

Since the mid-1990's so-called damascene processes have been the dominant technology for forming conductive interconnects in integrated circuits. Those skilled in the art recognize that damascene processing involves forming openings (via and trenches) in a dielectric layer and then filling the openings with a conductor, typically copper. The copper is typically deposited by initially depositing a thin seed layer within the openings and then filling the openings by electroplating copper.

FIG. 1 is a cross-sectional view of a prior art interconnect formed on a semiconductor device. In the figure, a patterned dielectric layer 54 is formed on a substrate 50. Formed within an opening of the patterned dielectric layer 54 and thereabove is a conductive layer 58. Formed between the dielectric layer 54 and the conductive layer 58 is a hard mask 56. A mask layer, such as a tri-layer photoresist layer 60 is formed above the conductive layer 58. In a later process, using the tri-layer photoresist layer 60 as a mask, the conductive layer 58 will be etched to form conductive lines 58 above the dielectric layer 54, as shown in FIG. 2.

The conventional copper metal line formation method can have a number of problems. One problem may be misalignment. In the process of device feature or pattern exposure, the alignment between successive layers that are being created is of critical importance. Smaller device dimensions place even more stringent requirements on the accuracy of the alignment of the successive layers that are superimposed on each other. In FIG. 2, following the etching of the conductive layer 58 in which the photoresist layer 60 is used as a mask to form conductive lines 58, via recesses VR may be formed at the juncture of a conductive line 58 and the hard mask 56 and/or the dielectric layer 54. Via recesses can be caused when the photoresist layer is misaligned (e.g., shifted to one side). Such misalignment can result from a mask misalignment failure, for example, during the photolithography process. Due to this misalignment, the via recess formed can be a serious problem in the conventional copper etch approach by causing unstable yield and decreased reliability.

BRIEF DESCRIPTION OF DRAWINGS

Embodiments of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

In the following description, specific details are set forth to provide a thorough understanding of embodiments of the present disclosure. However, one having ordinary skill in the art will recognize that embodiments of the disclosure can be practiced without these specific details. In some instances, well-known structures and processes are not described in detail to avoid unnecessarily obscuring embodiments of the present disclosure.

Embodiments will be described with respect to a specific context, namely an interconnect structure for an integrated circuit. Other embodiments may also be applied, however, to other semiconductor devices and features. For instance, the present teachings could be applied to structures other than an integrated circuit, such as an interposer device, a printed circuit board, a package substrate, and the like.

Figure 1:
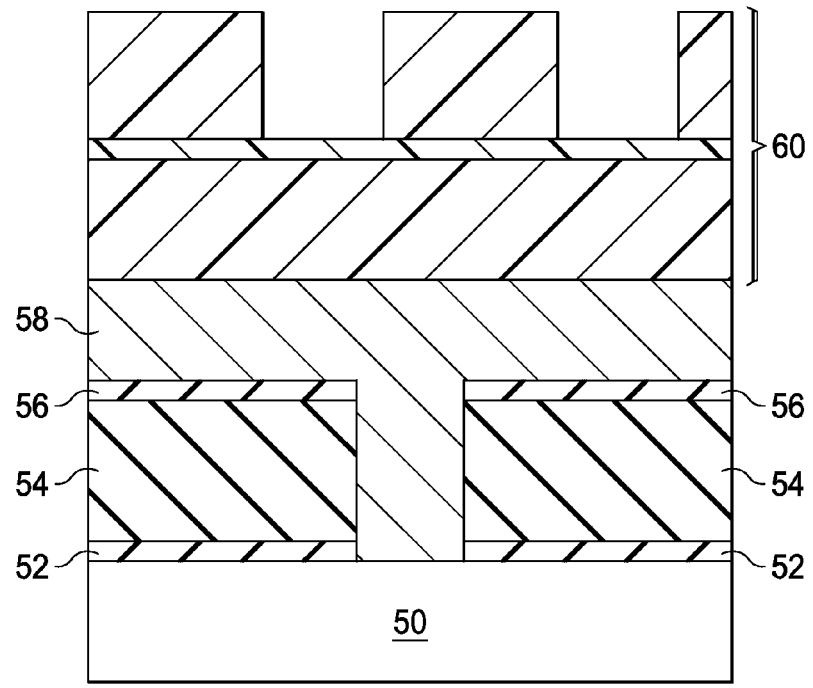
FIGS. 1 and 2 are cross-sectional views of a part of a prior art interconnect structure of a semiconductor device.
Figure 2:
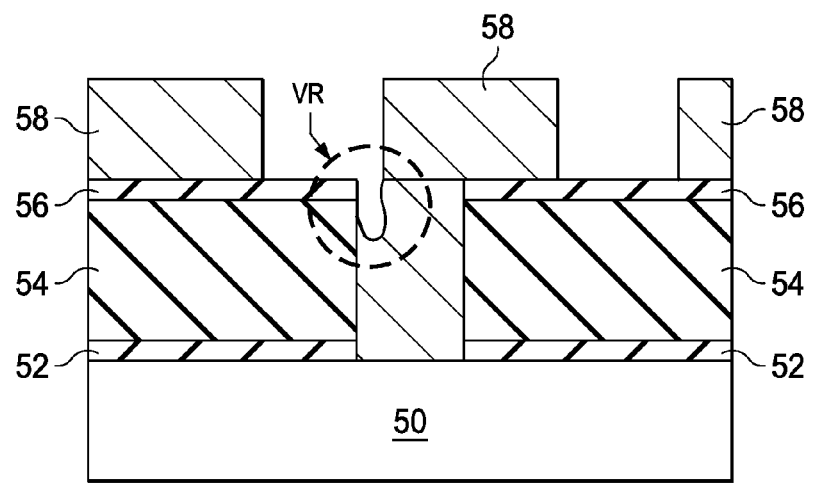
Figure 3:
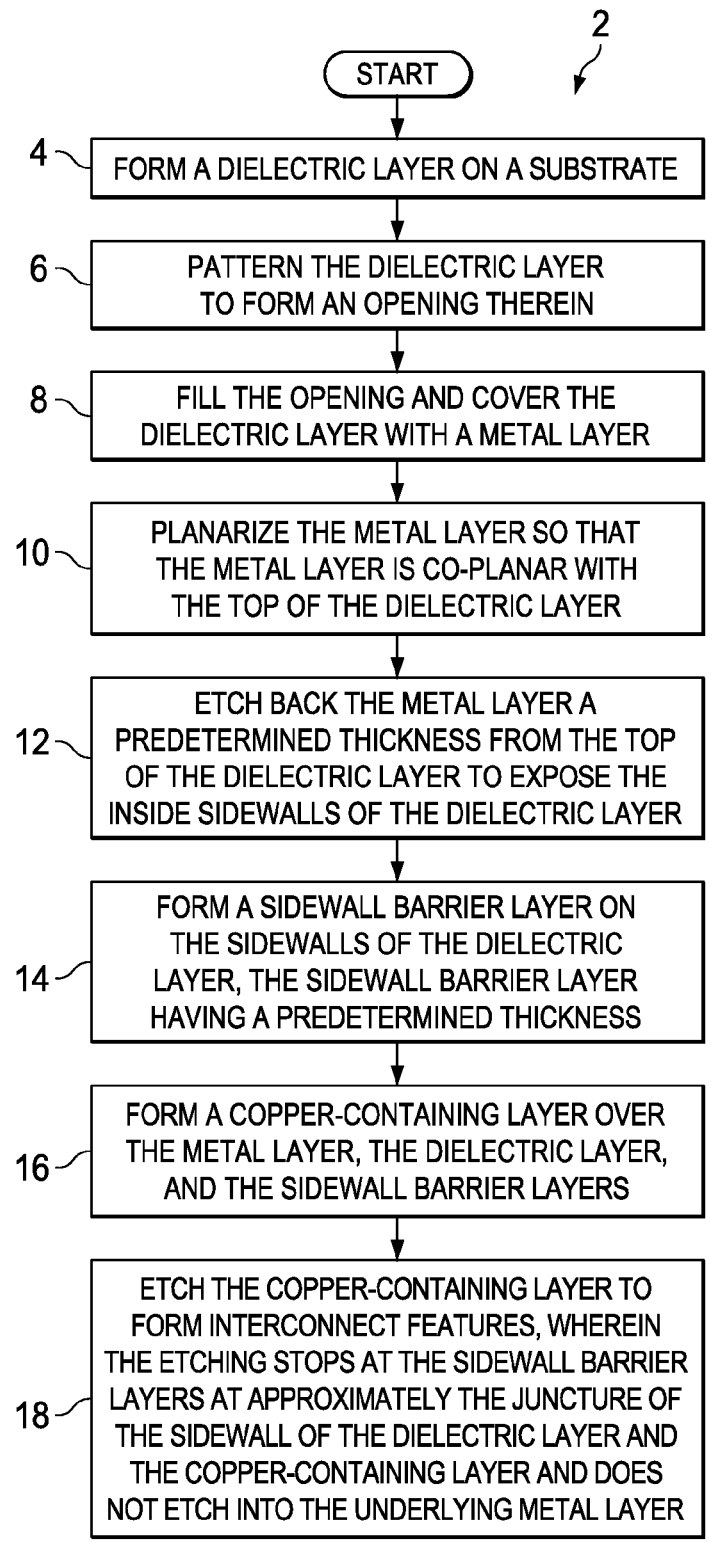
FIG. 3 is a flowchart of a method of fabricating an interconnect structure of a semiconductor device according to various embodiments of the present disclosure.

With reference now to FIG. 3, there is shown a flowchart of a method 2 for fabricating an interconnect structure of a semiconductor device according to various aspects of the present disclosure. Referring to FIG. 3, the method 2 includes block 4, in which a dielectric layer is formed on a substrate. The method 2 includes block 6, in which the dielectric layer is patterned to form an opening therein. The method 2 includes block 8, in which the opening is filled and the dielectric layer is covered with a metal layer. The method 2 includes block 10, in which the metal layer is planarized so that the metal layer is co-planar with the top of the dielectric layer. The method 2 includes block 12, in which the metal layer is etched back a predetermined thickness from the top of the dielectric layer to expose the inside sidewalls of the dielectric layer. The method 2 includes block 14, in which a sidewall barrier layer is formed on the sidewalls of the dielectric layer, the sidewall barrier layer having a predetermined thickness. The method 2 includes block 16, in which a copper-containing layer is formed over the metal layer, the dielectric layer, and the sidewall barrier layers. The method 2 includes block 18, in which the copper-containing layer is etched to form interconnect features, wherein the etching stops at the sidewall barrier layers at approximately the juncture of the sidewall of the dielectric layer and the copper-containing layer and does not etch into the underlying metal layer.

It is understood that additional processes may be performed before, during, or after the blocks 4-18 shown in FIG. 3 to complete the fabrication of the semiconductor device, but these additional processes are not discussed herein in detail for the sake of simplicity.

FIGS. 4-12 are diagrammatic fragmentary cross-sectional side views of a portion of a wafer at various fabrication stages according to embodiments of the method 2 of FIG. 3. It is understood that FIGS. 4-12 have been simplified for a better understanding of the inventive concepts of the present disclosure. It should be appreciated that the materials, geometries, dimensions, structures, and process parameters described herein are exemplary only, and are not intended to be, and should not be construed to be, limiting to the invention claimed herein. Many alternatives and modifications will be apparent to those skilled in the art, once informed by the present disclosure.

Figure 4:
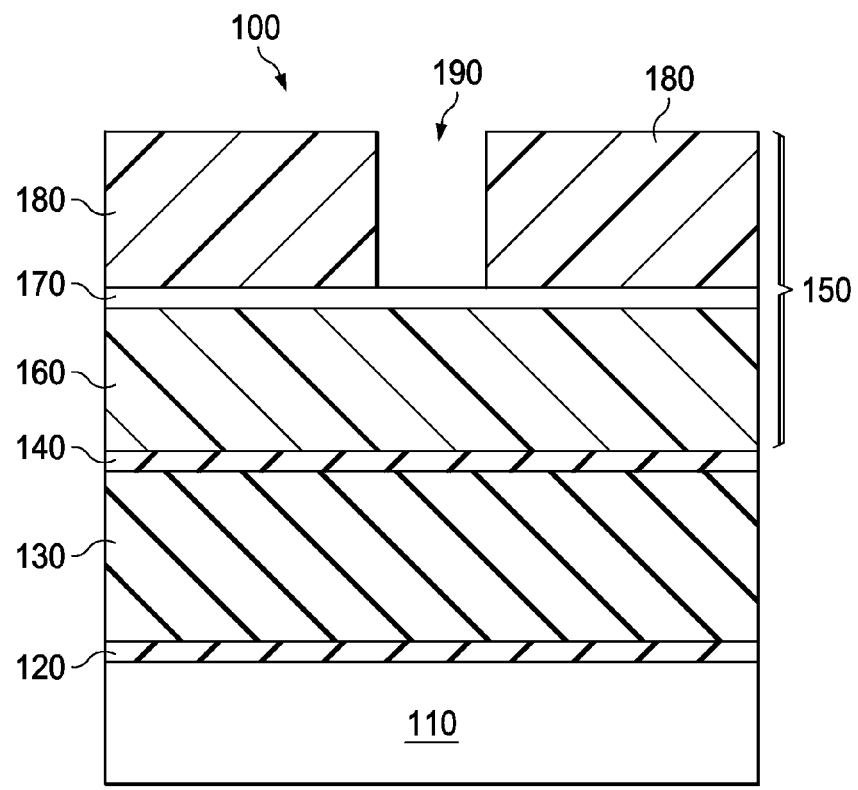
FIGS. 4-12 are diagrammatic fragmentary cross-sectional side views of a portion of a wafer at various stages of fabrication in accordance with various embodiments of the present disclosure.

With reference now to FIG. 4, there is shown an illustrative semiconductor structure 100 shown in highly simplified cross-sectional views. Various features not necessary for understanding of the invention have been omitted for sake of clarity and brevity. Semiconductor structure 100 includes a substrate 110 upon which has been formed an etch stop layer 120. Substrate 110 refers generally to any structures or materials underlying etch stop layer 120. In some applications, substrate 110 includes a semiconductor wafer such as a bulk silicon wafer or a silicon (or other semiconductor material) layer formed atop a bulk wafer and separated therefrom by, e.g., a buried oxide layer in a so-called silicon on insulator (SOI) arrangement. One or more active or passive devices, such as transistors or capacitors, could be formed in substrate 110. In another application, substrate 110 could be an underlying metal (or other conductor) layer in a multi-metal interconnect scheme. For instance, substrate 110 could be an underlying metal layer (or several stacked metal layers) manufactured according to the steps illustrated in FIGS. 4-12.

A dielectric layer 130, preferably a low-k dielectric layer 130 is formed on the etch stop layer 120. Low k generally refers to a dielectric layer having a dielectric constant of less than about 3.5. Materials such as porous silicon oxide, doped silicon oxide, silicon carbide, silicon oxynitride, and the like could be employed for dielectric layer 130, although these are examples only and are not intended to be exhaustive or limiting. The dielectric layer 130 may be formed on the etch stop layer 120 by a process such as, for example vapor deposition, plasma-enhanced chemical vapor deposition, spin on coating, or other like processes.

Hard mask 140 is formed atop dielectric layer 130. In a case where dielectric layer 130 is an oxide, hard mask 140 could be, for example, silicon nitride or another material that has a high degree of resistance to etchants typically employed to etch oxides. Other materials, such as SiCN, SiOC, and the like could also be employed for hard mask 140.

Mask 150 is formed atop hard mask 140. In the illustrated embodiment, mask 150 is a tri-layer mask comprising three separate layers. While a conventional mask layer, such as a single polymer photoresist layer, could be employed, a tri-layer mask 150 allows for the formation of finer features having smaller dimensions and pitch. In the illustrated embodiment, bottom layer 160 of tri-layer mask 150 is a carbon organic layer, similar to a conventional photoresist layer. Middle layer 170 is a silicon containing carbon film, employed to help pattern bottom layer 160. Top layer 180 is a photoresist material, such as for instance, a photoresist material designed for exposure to 193 nm wavelengths, and preferably designed for immersion photolithography, for instance.

Figure 5:
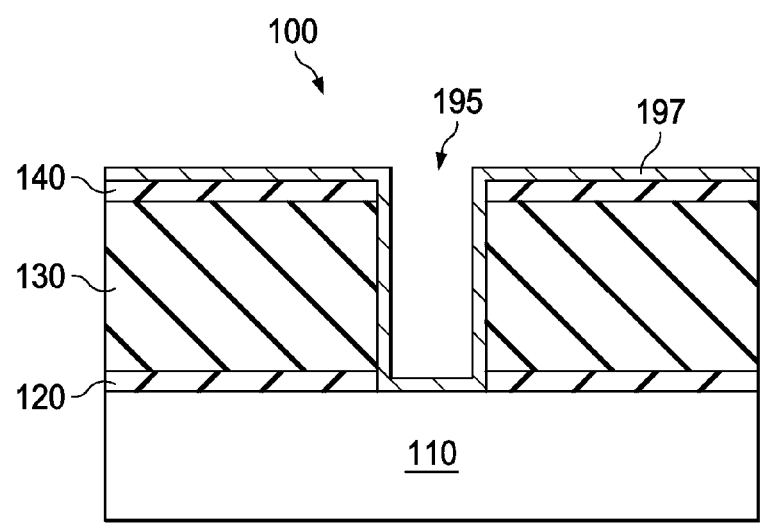

As shown in FIG. 4, an opening 190 is formed in mask 150, using known lithography techniques, such as for instance, immersion photolithography. This opening will be transferred to all layers of mask 150, through hard mask 140 and then to dielectric layer 130 and etch stop layer 120, resulting in an opening 195, sometimes referred to herein as a via opening, being formed in dielectric layer 130 and etch stop layer 120, as shown in FIG. 5. Note that opening 195 exposes an underlying portion of substrate 110 which, as described above, could be an underlying conductive interconnect, a transistor contact, or the like. Mask 150 is removed using known ashing and/or etching techniques, the details of which are omitted herein. In some embodiments, as shown in FIG. 5, a thin layer of barrier metal film 197 may be deposited by known deposition methods and formed in the opening 195 and on the hard mask 140. The barrier metal film 197 functions to prevent copper atoms from diffusing into the dielectric layer 130 when metal lines and/or metal vias are later formed.

Figure 6:
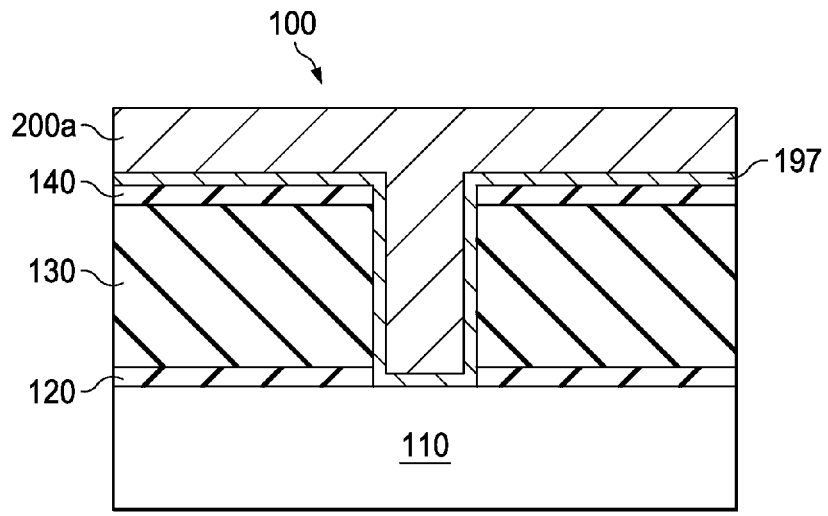

Turning now to FIG. 6, a metal layer 200a is deposited over semiconductor structure 100. In illustrated embodiments, a material of the metal layer 200a is a copper alloy. Examples of a suitable copper alloy include CuMn, CuCr, CuV, CuNb, and CuTi. The copper alloy may be in the range of from about 90% copper to about 99.8% copper in some embodiments. Other suitable alloys and percentages will be apparent to those skilled in the art upon undertaking routine experimentation once informed by the present disclosure. By using a copper alloy material, it is possible to manufacture copper interconnects without the need to form barrier lines, such as Ta, TaN, and the like, that are commonly employed in conventional damascene processes. That being said, it is within the contemplated scope of the present invention that a barrier liner could be employed in some applications.

In one embodiment, metal layer 200a is formed by a plasma vapor deposition (PVD) that completely fills opening 195 and forms a blanket coating over a top surface of dielectric layer 130, or more accurately over the top surface of hard mask 140 overlying dielectric layer 130. In some embodiments, hard mask 140 may be omitted, in which case metal layer 200a would be formed on dielectric layer 130. Metal layer 200a may be formed to a thickness above dielectric layer 130 of from about 500 A to about 2 um, depending upon the desired application and the technology node employed.

In another embodiment, metal layer 200a is formed by first depositing a seed layer by, e.g., physical vapor deposition techniques. The seed layer could be formed to a thickness of perhaps about 20 A to about 100 A, although other thicknesses could be employed depending upon the application and the desired process. Then a copper alloy material is formed on the seed layer using, e.g., an electroplating or electro-less plating technique.

Figure 7:
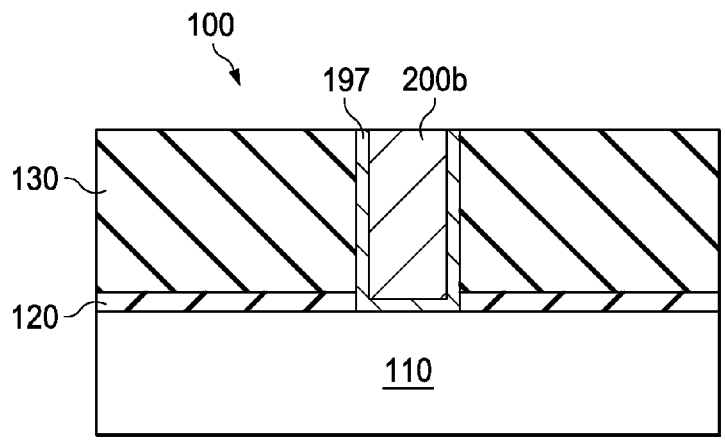
Figure 8:
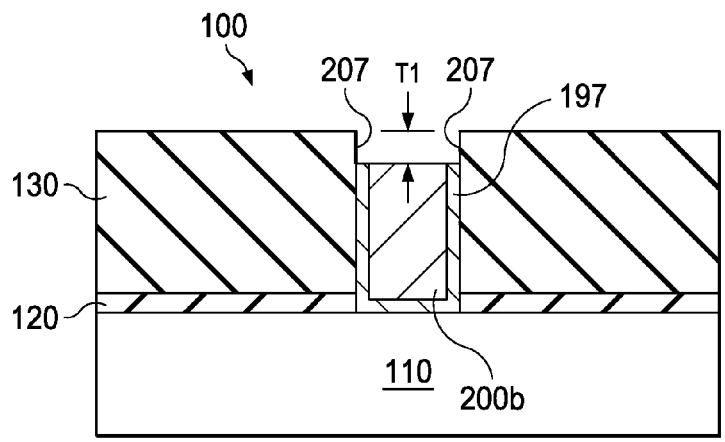

The metal layer 200a and the hard mask 140 are planarized by a chemical mechanical polishing (CMP) or an etch back step, for example to form a metal feature 200b whose top is substantially co-planar with a top surface of the dielectric layer 130, as illustrated in FIG. 7. The metal feature 200b may be a metal via or a metal line, for example. Through an etch back process or other suitable process the metal feature 200b is thereafter etched back an amount T1 from the top of the dielectric layer 130 to expose the inside sidewalls 207 of the dielectric layer 130, as shown in FIG. 8. The amount T1 of the metal feature 200b etched back depends upon the desired application and the technology node employed. In one embodiment, the metal feature 200b is etched back from about 50 Angstroms to about 100 Angstroms. In another embodiment, the metal feature 200b is etched back from about 70 Angstroms to about 80 Angstroms.

Figure 9:
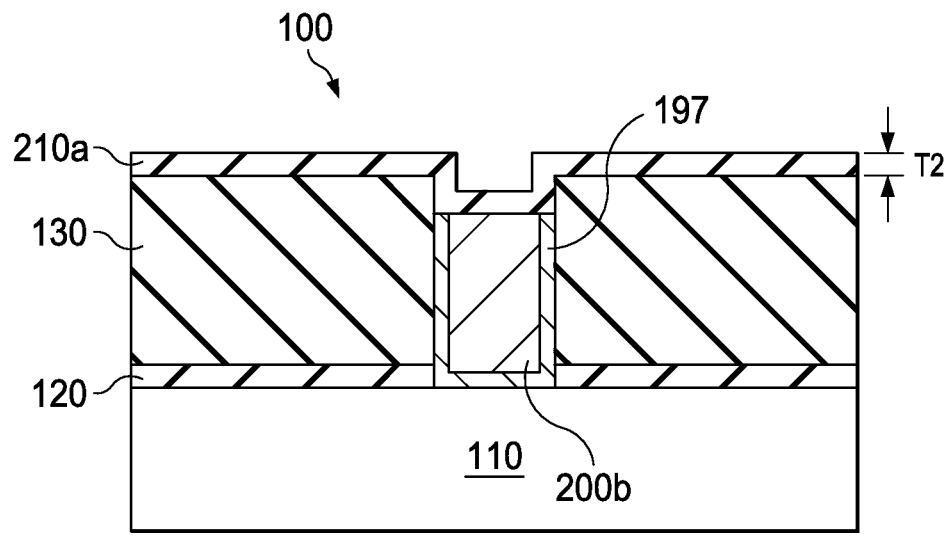

With reference now to FIG. 9, a barrier layer 210a is formed over the dielectric layer 130, on the exposed sidewalls 207 of the dielectric layer 130, and above the metal feature 200b. The barrier layer 210a acts as both an etching stop layer and/or a copper or copper alloy diffusion barrier layer. As such, the barrier layer 210a comprises a material that provides sufficient copper etch resistance and/or sufficiently prevents copper or copper alloy diffusion into a surrounding area such as, for example dielectric layer 130. In one embodiment, the barrier layer 210a comprises carbon-nitride (CN). In another embodiment, the barrier layer 210a comprises amorphous carbon. In yet another embodiment, the barrier layer 210a comprises organic carbon. In yet another embodiment, the barrier layer 210a comprises a self-assembly monolayer, such as for example organic silane.

The barrier layer 210a is deposited by known deposition methods such as, for example physical vapor deposition (PVD), chemical vapor deposition (CVD), plasma-enhanced chemical vapor deposition (PECVD), atomic layer deposition (ALD), or spin-on coating. According to one embodiment, the barrier layer 210a is deposited by a plasma polymerization process using a $C_xH_y$ gas with $N_2$ or $NH_3$ in a low temperature of from about 25 Celsius to about 250 Celsius. The barrier layer 210a maybe deposited to a thickness of from about 30 Angstroms to about 100 Angstroms. In some embodiments, the barrier layer 210a has a thickness of from about 50 Angstroms to about 80 Angstroms.

Figure 10:
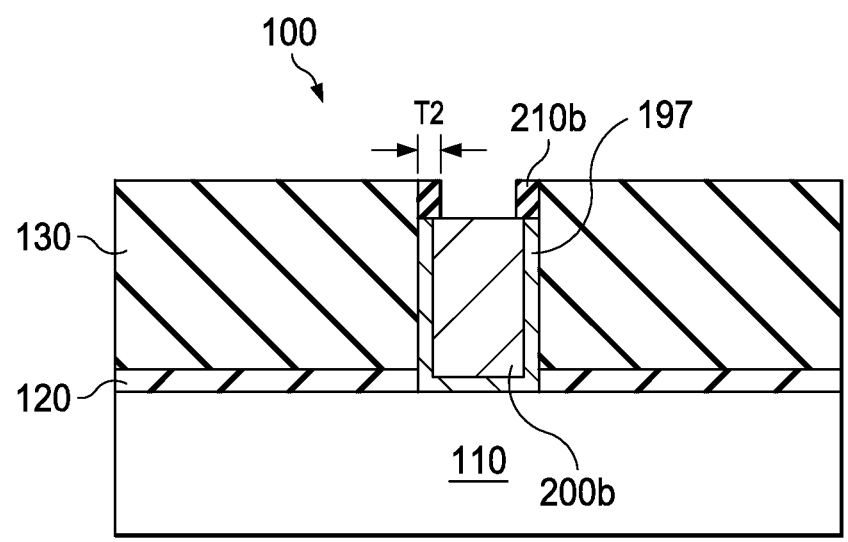

Following the deposition of the barrier layer 210a on the substrate 110, an etch back process or other suitable process removes the barrier layer 210a on the top of the dielectric layer 130 leaving a portion of the barrier layer 210a or sidewall barrier layer 210b on the sidewalls 207 of the dielectric layer 130, as illustrated in FIG. 10.

Figure 11:
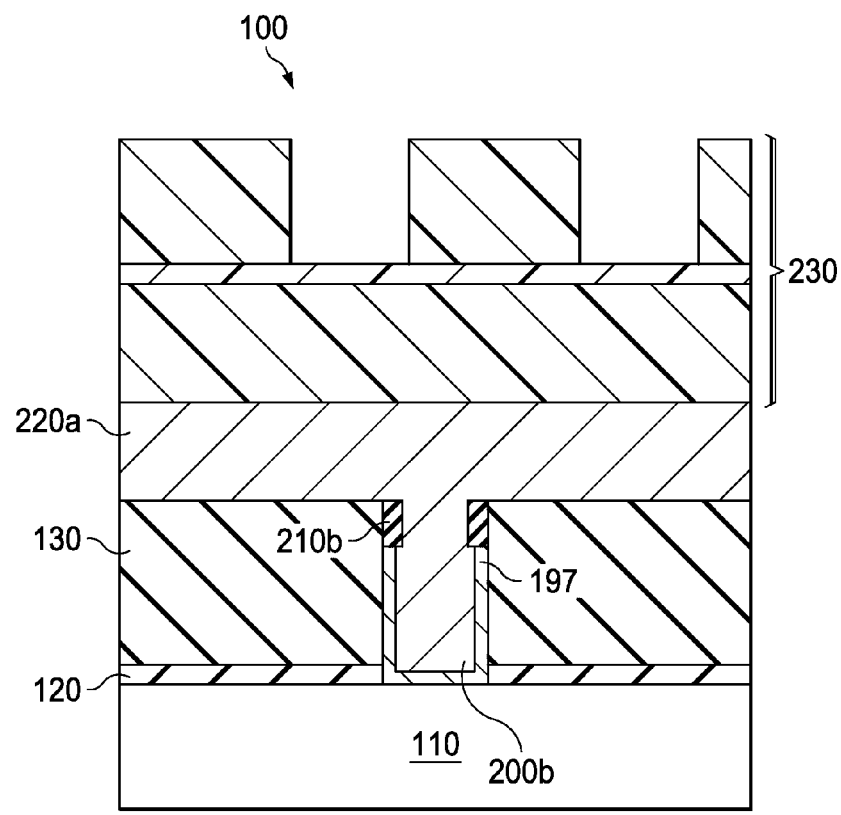

Referring now to FIG. 11, a copper-containing layer 220a is deposited over the metal feature 200b, the sidewall barrier layers 210b, and the dielectric layer 130. In an exemplary embodiment, the copper containing layer 220a has from about 90% to about 100% copper. The copper-containing layer 220a may be deposited by plasma vapor deposition (PVD), for example. The copper containing layer 220a is thereafter thinned down (e.g., via chemical mechanical polish, CMP, by etch back, or the like).

Although not shown in FIG. 11, an etch stop layer may be formed on the planarized copper containing layer 220a. In one embodiment, the etch stop layer is formed of silicon nitride, silicon carbon nitride, or another material that provides sufficient etch resistance relative to the copper containing layer 220a.

Figure 12:
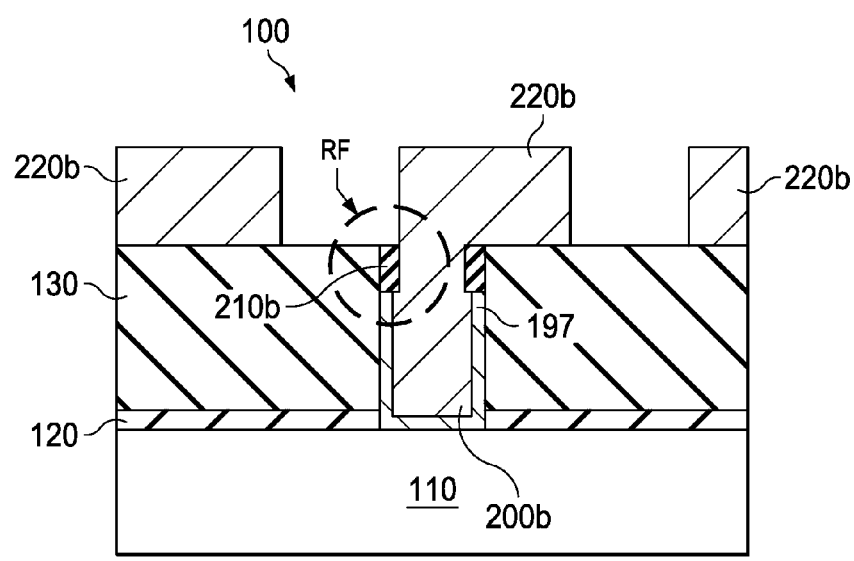

Also shown in FIG. 11 is a second mask 230 formed on the copper-containing layer 220a. In the illustrated example, mask 230 is a tri-layer mask similar to mask 150 illustrated in FIG. 4. As with the previously described steps, it is not necessary to use a tri-layer mask, unless the particular application and feature size calls for such an approach. Regardless of the type of mask employed, a pattern is formed in mask 230 as shown in FIG. 11. Next, as shown in FIG. 12, the pattern is transferred to copper containing layer 220a using known lithography techniques. Copper containing layer 220a is preferably etched anisotropically to form nearly vertical sidewalls. In some embodiments, a chlorine plasma etch is employed to pattern copper containing layer 220a. Other plasma etches, including reactive ion etching (RIE), could also be employed.

The result of the etching step is that the copper containing layer 220a is patterned into interconnect features or interconnects 220b. These interconnect features 220b run across the major surface of semiconductor structure 100 and may be metal lines, metal vias, or via features to provide vertical electrical routing between metal lines. The etching stops at the sidewall barrier layers 210b and does not etch thereunder, thus avoiding undesirable recesses that may be formed in the prior art method and resulting in a recess free (RF) semiconductor structure 100. The sidewall barrier layers 210b eliminate or reduce the amount of undercutting that will occur in the metal feature 200b. As can be seen from FIG. 12, there is little or no undercutting of the metal feature 200b.

Further processing steps could include depositing a dielectric layer in the openings between the interconnect features 220b and planarizing the dielectric layer. The above described process steps may be repeated for the formation of additional vertical and horizontal interconnect features.

Although the present embodiments and their advantages have been described in detail, it should be understood that various changes, substitutions and alterations can be made herein without departing from the scope of the disclosure as defined by the appended claims.

The present disclosure has described various exemplary embodiments. According to one embodiment, a method for forming a semiconductor interconnect structure comprises forming a dielectric layer on a substrate and patterning the dielectric layer to form an opening therein. The opening is filled and the dielectric layer is covered with a metal layer. The metal layer is thereafter planarized so that the metal layer is co-planar with the top of the dielectric layer. The metal layer is etched back a predetermined thickness from the top of the dielectric layer to expose the inside sidewalls thereof. A sidewall barrier layer is formed on the sidewalls of the dielectric layer. A copper-containing layer is formed over the metal layer, the dielectric layer, and the sidewall barrier layers. The copper-containing layer is etched to form interconnect features, wherein the etching stops at the sidewall barrier layers at approximately the juncture of the sidewall of the dielectric layer and the copper-containing layer and does not etch into the underlying metal layer.

According to another embodiment, a method for forming an integrated circuit interconnect structure comprises forming a via opening in a dielectric layer and filling the via opening and covering the dielectric layer with a copper alloy layer. The copper alloy layer is planarized so that the copper alloy layer is co-planar with the top of the dielectric layer. The copper alloy layer is recessed back from the top of the dielectric layer a predetermined thickness to expose the inside sidewalls of the dielectric layer. A sidewall barrier layer is formed on the sidewalls of the dielectric layer, the sidewall barrier layer having a predetermined thickness. A copper-containing layer is formed over the copper alloy layer, the dielectric layer, and the sidewall barrier layers. The copper-containing layer is etched to form interconnect features, wherein the etching stops at the sidewall barrier layers, thereby preventing the inside sidewalls of the dielectric layer from being recessed due to the etching.

According to yet another embodiment, an integrated circuit interconnect structure comprises a dielectric layer on a substrate; a copper alloy feature extending substantially vertically into the dielectric layer, the copper alloy feature being recessed back from the top of the dielectric layer at a predetermined thickness; and a sidewall barrier layer on the sidewalls of the dielectric layer above the copper alloy feature, the sidewall barrier layer having a predetermined thickness.

In the preceding detailed description, specific exemplary embodiments have been described. It will, however, be apparent to a person of ordinary skill in the art that various modifications, structures, processes, and changes may be made thereto without departing from the broader spirit and scope of the present disclosure. The specification and drawings are, accordingly, to be regarded as illustrative and not restrictive. It is understood that embodiments of the present disclosure are capable of using various other combinations and environments and are capable of changes or modifications within the scope of the claims.

What is claimed is:

1. A method for forming a semiconductor interconnect structure, comprising:
    forming a dielectric layer on a substrate;
    patterning the dielectric layer to form an opening in the dielectric layer;
    forming a diffusion barrier layer on sidewalls of the opening, the diffusion barrier layer having a first thickness;
    filling the opening and covering the dielectric layer with a metal layer;

planarizing the metal layer so that the metal layer is co-planar with a top of the dielectric layer;
etching back the metal layer and the diffusion barrier layer a first distance from the top of the dielectric layer to expose inside sidewalls of the dielectric layer;
forming a sidewall barrier layer on the exposed inside sidewalls of the dielectric layer, the sidewall barrier layer having a second thickness, the sidewall barrier layer only partially extending over the metal layer, the second thickness being greater than the first thickness;
forming a copper-containing layer over the metal layer, the dielectric layer, and the sidewall barrier layers; and
etching the copper-containing layer to form interconnect features, wherein the etching stops at the sidewall barrier layer at approximately a juncture of the inside sidewall of the dielectric layer and the copper-containing layer and does not etch into the metal layer.

2. The method of claim 1, further comprising:
forming an etch stop layer over the substrate prior to forming the dielectric layer.

3. The method of claim 1, wherein forming the dielectric layer on the substrate comprises:
depositing a dielectric layer selected from the group consisting essentially of silicon oxide, silicon oxynitride, silicon carbide, and combinations thereof, using a process selected from the group consisting essentially of chemical vapor deposition, plasma enhanced chemical vapor deposition, spin on coating, and combinations thereof.

4. The method of claim 1, wherein patterning the dielectric layer to form the opening comprises:
forming a hard mask over the dielectric layer;
forming a tri-layer mask over the hard mask;
forming an opening in the tri-layer mask;
forming an opening in the hard mask using the tri-layer mask as a pattern; and
isotropically etching the opening in the dielectric layer.

5. The method of claim 1, wherein filling the opening and covering the dielectric layer with the metal layer comprises:
lining the opening in the dielectric layer with a copper alloy seed layer using a physical vapor deposition process; and
electroplating a copper alloy in the opening and over the dielectric layer.

6. The method of claim 1, wherein the first distance is from about 50 Angstroms to about 100 Angstroms.

7. The method of claim 1, wherein forming the sidewall barrier layer on the exposed inside sidewalls of the dielectric layer comprises:
forming a barrier layer above the dielectric layer, on the exposed inside sidewalls of the dielectric layer, and above the metal layer; and
etching back the barrier layer from the top of the dielectric layer, leaving the sidewall barrier layer on the exposed inside sidewalls of the dielectric layer.

8. The method of claim 7, wherein the barrier layer is formed by physical vapor deposition (PVD), chemical vapor deposition (CVD), plasma-enhanced chemical vapor deposition (PECVD), atomic layer deposition (ALD), or spin-on coating.

9. The method of claim 1, wherein the sidewall barrier layer comprises a material selected from the group consisting essentially of carbon nitride (CN), amorphous carbon, organic carbon, self-assembly monolayer, and combinations thereof.

10. The method of claim 1, wherein the second thickness is from about 30 Angstroms to about 100 Angstroms.

11. The method of claim 1, further comprising:
forming an etch stop layer over the copper-containing layer prior to etching the copper-containing layer.

12. A method for forming an integrated circuit interconnect structure, comprising:
forming a via opening in a dielectric layer;
lining sidewalls of the via opening with a diffusion barrier layer;
filling the via opening and covering the dielectric layer with a copper alloy layer;
recessing back the copper alloy layer and the diffusion barrier layer from a top of the dielectric layer a first distance to expose inside sidewalls of the dielectric layer;
forming a sidewall barrier layer on the exposed inside sidewalls of the dielectric layer, at least a portion of the copper alloy layer being exposed through an opening in the sidewall barrier layer, at least a portion of the sidewall barrier layer extending over an interface between the diffusion barrier layer and the copper alloy layer;
forming a copper-containing layer over the copper alloy layer, the dielectric layer, and the sidewall barrier layer;
etching the copper-containing layer to form a thinned copper-containing layer; and
patterning the thinned copper-containing layer to form interconnect features, wherein at least a portion of the thinned copper-containing layer extends above an uppermost surface of the sidewall barrier layer after the patterning.

13. The method of claim 12, wherein the first distance is from about 50 Angstroms to about 100 Angstroms.

14. The method of claim 12, wherein forming a sidewall barrier layer on the exposed inside sidewalls of the dielectric layer comprises:
forming a barrier layer above the dielectric layer, on the exposed inside sidewalls of the dielectric layer, and above the copper alloy layer; and
etching back the barrier layer from the top of the dielectric layer, leaving the sidewall barrier layer on the exposed inside sidewalls of the dielectric layer.

15. The method of claim 14, further comprising planarizing the copper alloy layer so that the copper alloy layer is co-planar with the top of the dielectric layer, prior to the recessing step.

16. The method of claim 12, wherein the sidewall barrier layer comprises carbon nitride (CN) and has a thickness of from about 30 Angstroms to about 100 Angstroms.

17. A method of forming an integrated circuit interconnect structure, comprising:
depositing a dielectric layer on a substrate;
etching the dielectric layer to form a via opening having sidewalls in the dielectric layer;
forming a diffusion barrier layer lining a lower portion of the sidewalls and extending along the sidewalls less than a full height of the via opening;
forming a sidewall barrier layer lining an upper portion of the sidewalls and extending along the sidewalls less than a full depth of the via opening, wherein a topmost surface of the sidewall barrier layer is substantially coplanar with a topmost surface of the dielectric layer, and wherein sidewall barrier layer is thicker than the diffusion barrier layer;
filling the via opening with a copper alloy feature, wherein a first portion of the copper alloy feature is disposed directly below a bottommost surface of the sidewall barrier layer and a second portion of the copper alloy feature is disposed directly above a topmost surface of the sidewall barrier layer; and thinning the second portion of the copper alloy feature, wherein at least a portion of the second portion of the copper alloy feature remains disposed directly above the topmost surface of the sidewall barrier layer after the thinning, and wherein the topmost surface of the sidewall barrier layer is a farthest surface of the sidewall barrier layer from the substrate.

18. The method of claim 17, further comprising recessing the copper alloy feature from the topmost surface of the dielectric layer from about 50 Angstroms to about 100 Angstroms.

19. The method of claim 17, wherein the step of forming a sidewall barrier layer comprises depositing carbon nitride (CN) to a thickness of from about 30 Angstroms to about 100 Angstroms.

20. The method of claim 17, wherein thinning the second portion of the copper alloy feature comprises performing a chemical mechanical polishing process on the copper alloy feature.

\* \* \* \* \*